(12) United States Patent
Nakamura et al.

(10) Patent No.: US 6,717,062 B2
(45) Date of Patent: Apr. 6, 2004

(54) BATTERY PACK AND BATTERY CASE USED FOR THE SAME, AND METHOD FOR PRODUCING THE SAME

(75) Inventors: Satoshi Nakamura, Kyoto (JP); Kohshi Nishimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/896,111

(22) Filed: Jul. 2, 2001

(65) Prior Publication Data

US 2002/0039283 A1 Apr. 4, 2002

(30) Foreign Application Priority Data

| Jul. 3, 2000 | (JP) | .................... P2000-201302 |
| Jul. 4, 2000 | (JP) | .................... P2000-201768 |

(51) Int. Cl.[7] ............................................... H05K 1/00
(52) U.S. Cl. ..................................... 174/257; 174/260
(58) Field of Search ................................ 174/261, 267, 174/252, 257, 260; 361/772–776

(56) References Cited

U.S. PATENT DOCUMENTS

| 3,469,019 | A | * | 9/1969 | Reimann ...................... 174/257 |
| 5,317,479 | A | * | 5/1994 | Pai et al. ...................... 361/773 |
| 5,773,889 | A | * | 6/1998 | Love et al. ................... 257/737 |
| 6,356,768 | B1 | * | 3/2002 | Saito et al. ................... 455/550 |
| 6,476,333 | B1 | * | 11/2002 | Khandros et al. ........... 174/267 |

* cited by examiner

*Primary Examiner*—David A. Zarneke
*Assistant Examiner*—Jeremy Norris
(74) *Attorney, Agent, or Firm*—Morgan, Lewis & Bockius LLP

(57) ABSTRACT

A circuit board module comprises a battery case 101 storing a battery of which external terminals 4 have a laminated members 8 made of different metal material for each other, a circuit board 102 for carrying out charge and discharge of the above-mentioned battery, and a joint member 103 for connecting the battery case 101 and the circuit board 102 electrically and/or mechanically, wherein the joint body 103 is constructed by clad material that a first metal layer 111 and a second metal layer 112 made of different metal materials each other are laminated.

6 Claims, 11 Drawing Sheets

BATTERY PACK AND BATTERY CASE USED FOR THE SAME, AND METHOD FOR PRODUCING THE SAME

BACKGROUND OF THE INVENTION

1. Field of the Invention

The present invention relates to a circuit board applied for a battery pack detachable from a portable electronic apparatus such as a portable telephone and a note type personal computer for example, and a method for producing the circuit board.

The present invention also relates to a circuit board module used for a portable telephone, etc. for example and applied for a battery pack with a built-in cell for a battery, and to a method for producing the circuit board module.

2. Description of the Related Art

In conventional ways, a battery pack with a buil-in cell for battery such as a lithium ion battery, etc. has been provided for a portable telephone and a note type personal computer for example, and the battery pack is detachable from main body of the portable telephone and the like. By using the above battery pack, the above portable telephone and the like can be used for certain time without being supplied power voltage from a commercial power source.

Figure 5:
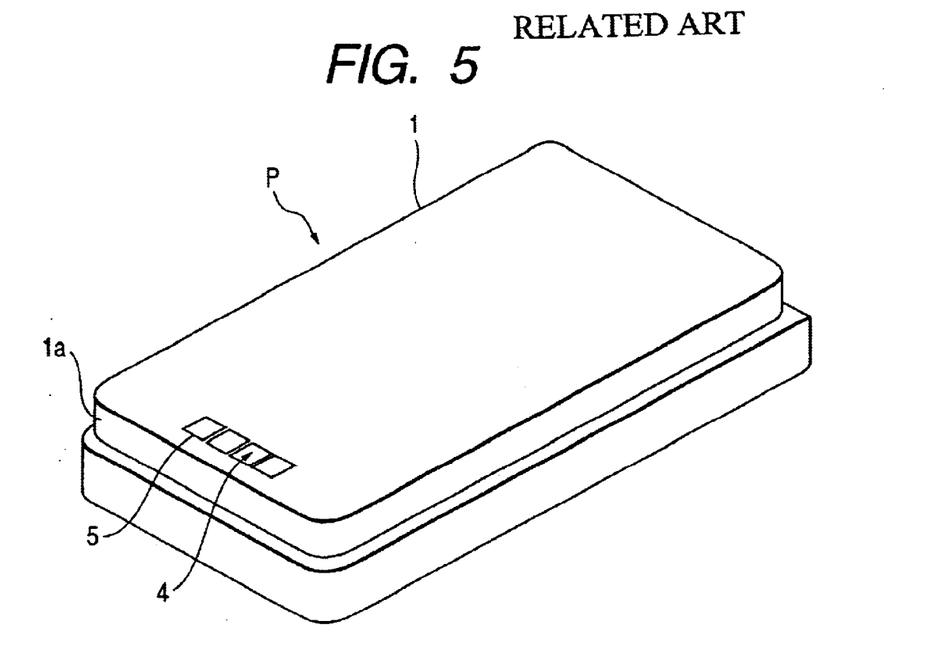
FIG. 5 shows a perspective view of a battery pack.
Figure 6:
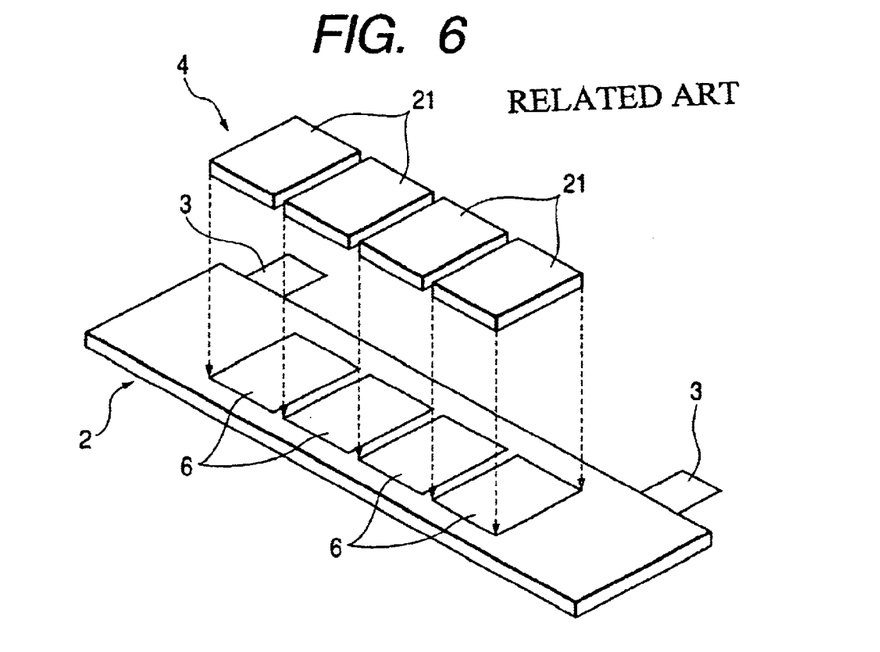
FIG. 6 shows a perspective view of the conventional circuit board installed in a battery pack.

FIG. 5 is a perspective view showing an example such the battery pack and FIG. 6 is a perspective view showing an example of a circuit board installed in the battery pack. The battery pack P provides a case 1 made of resin and the case 1 installs a circuit board 2 connected to a battery cell not shown.

On the circuit board 2, a wiring pattern not shown is formed, and plural external terminal portions 4 are formed on lands 6 formed as a part of the wiring pattern by joining roughly square shaped Ni pieces 21 cut from hoop material of pure Ni for example. The circuit board 2 is supported along inside of the case 1 so that the external terminal portions 4 expose out through openings 5 (see FIG. 5) formed on the surface of the case 1. The battery pack 1 is possible to connect electrically to the main body of the portable telephone (not shown) by contacting connector pins (not shown) formed at the main body.

At the circuit board 2, connecting terminals 3 made of metal piece for connecting to the battery cell are provided. The circuit board 2 supplies electric power to the above main body and charges the battery cell through the connecting terminals 3 and each external terminal portion 4. The circuit board 2 includes a protecting circuit (not shown) for preventing over charge and over discharge in the battery cell.

The external terminals 4 are formed by joining the Ni pieces 21 on the lands 6 of the wiring pattern as described above, or by plating the above Ni pieces 21 with Au for example.

However, the above Ni pieces 21 have comparatively high in contact resistance so that contact failure occasionally happens at connection to the main body of the portable telephone. Pure Ni is frequently used for the Ni pieces 21 and there is a problem that cost of the pure Ni increases and soldering on the lands 6 of the wiring pattern is difficult. Then, it is considerable that the external terminals 4 are formed by plating on the lands 6 of the wiring pattern with hard Au. However, there is a problem that Au has bad yield because Au is easy to have a scratch on the surface thereof.

Further, a battery pack with a built-in cell for battery such as a lithium ion battery, etc. has been provided for a portable telephone and a note type personal computer for example, and the battery pack is detachable from main body of the portable telephone and the like.

In the above battery pack, a circuit board module is assembled, which is constructed with a battery case for storing the cell for battery and a circuit board including a circuit for supplying electric power to the main body of the portable telephone and preventing over-discharge and over-charge. The battery case and the circuit board are connected electrically and/or mechanically by a roughly long rectangular joint body which hoop material of Ni, for example, is cut to the designated size.

In recent year, Al is frequently used for material of the battery case responding to a request of lightening a portable telephone, and so on. However, since the join body is made of Ni, desirable contact between metals can not be obtained in connection between the battery case and the joint body so that the connection does not become stable connecting state.

Figure 19:
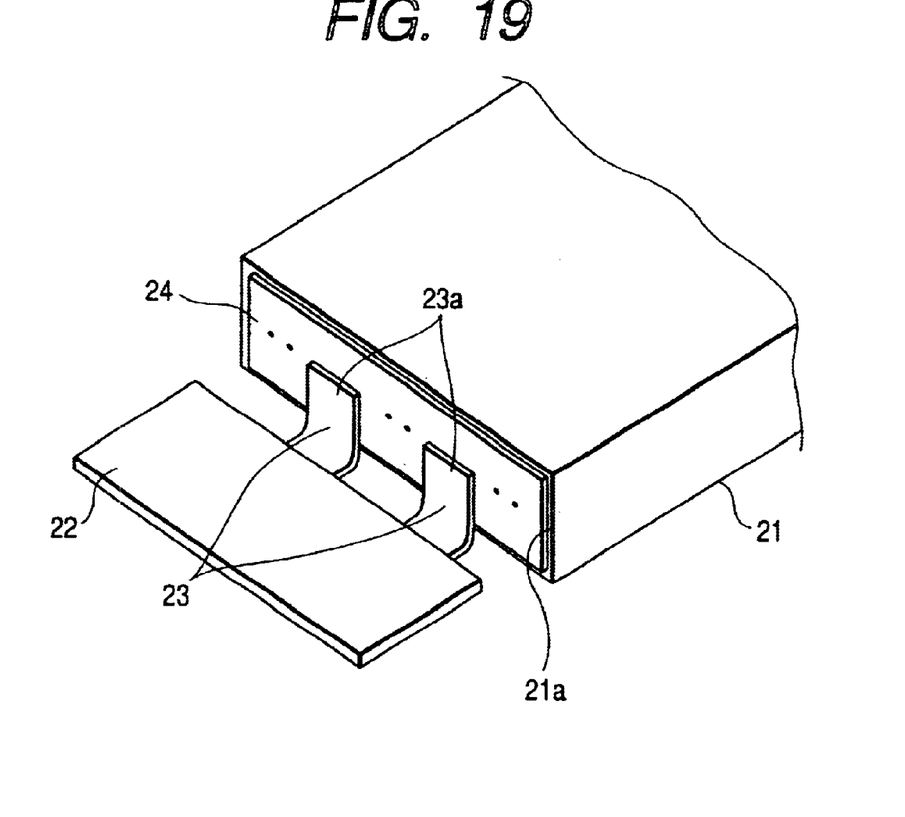
FIG. 19 shows a perspective view of a main portion of the conventional circuit board module.
Figure 20:
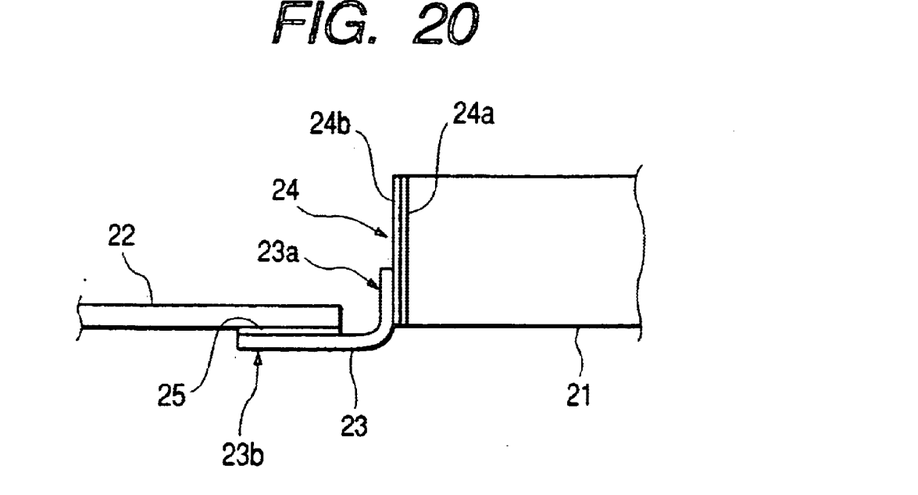
FIG. 20 shows a sectional view of a main portion of the circuit board module shown in FIG. 19.

Then, so called clad material bonded with metal body consisting of different metal materials each other for connection between the battery case 121 and the circuit board 122 as shown in FIG. 19 and FIG. 20. That is, the above-mentioned clad material is stood between the battery case 121 and a joint body 123 so as to joint the both. Concretely, when material of the battery case 121 is Al for example, a clad material in which metal material of one metal layer 124a is Al and metal material of other metal layer 124b is Ni as a joining member 124 is provided, and one metal layer 124a side of the joining member 124 is contacted to side face 121a of the battery case 121. Then, the battery case 121 and the joining member 124 are joined by spot welding for example so as to integrate.

By such the way, other metal layer 124b side made of Ni of the joining member 124 exposes outside, and to other metal layer 124b of the joining member 124, one end portion 123a of the joint body 123 made of Ni being the same metal material as the metal layer is joined by welding. Other end portion of bent joint body 123 and a pad portion 125 of the circuit board 122 are connected by soldering. Thus, the battery case 121 and the joint body 123 have good connection between metals and stable connecting state.

However, in the circuit board module of the above construction, when the circuit board 122 is connected to the battery case 121, the joining member 124 made of clad material and the joint body made of Ni must be used each other. Accordingly, since parts cost becomes high because of many parts and welding operation for joining the joining member 124 to the battery case 121 or joining the joint body 123 to the joining member 124 takes time, there has been a problem that operation cost increases.

SUMMARY OF THE INVENTION

The invention is considered on the above-mentioned circumstances, the problem is to provide a circuit board decreasing parts cost and removing problems such as contact failure, a battery pack using the circuit board, and a method for producing the circuit board.

To solve the above problems, the invention has the following technical means.

According to a battery pack concerned in a first aspect of the invention, the battery pack comprises a board and an external terminal portion formed on the board for connecting to an external apparatus wherein the external terminal portion is constructed by clad material that plural metal layers having different metal material each other are laminated. Concretely, the external terminal is constructed by a first metal layer made of Cu, a second metal layer formed on the first metal layer and made of stainless steel, and a third metal layer formed on the second metal layer and made of Ni alloy.

According to the above construction, decrease of parts cost at the circuit board can be designed because the clad material constructed as above-mentioned for the external terminal portion provided in the battery pack instead of Ni piece expensive generally used for the conventional construction.

Since Cu is used for the first metal layer of the external terminal portion and the first metal layer is joined to the land of the wiring pattern formed on the board and made of Cu foil for example, contact between these metals becomes good state and adhesiveness of the external terminal portion to the wiring pattern can be raised. Since stainless steel is used for the second metal layer, corrosion resistance of whole of the external terminal portion can be raised and rigidity can be made large. For example, by setting thickness of the second metal layer to suitable value, bend at soldering the above-mentioned clad material on the circuit board by reflow process can be depressed. Since Ni alloy is used for the third metal layer being as the highest layer, the surface does not have scratch like as plating by Au for example and yield can be removed.

According to a battery pack concerned in a second aspect of the invention, the battery pack comprises a case, a battery installed in the case, and a circuit board connected to the battery and according to the first aspect, wherein the case has an opening and the circuit board is located so that the external terminal portion faces outside from the above-mentioned opening.

According to the above-mentioned construction, the external terminal portion of the circuit board is constructed by clad material, the external terminal portion is formed so as to face outside from the opening, and is connected to the main body of the external apparatus, for example, the portable telephone. Because of that, good connecting state can be kept without occurring contact failure to the main body of the portable telephone and the battery pack of low cost can be provided.

According to a method for manufacturing a circuit board concerned in a third aspect of the invention, the method for manufacturing a circuit board having a board and an external terminal portion formed on the board for connecting to an external apparatus, comprising a process making a laminated member by laminating plural metal layers having different metal material each other, and a process forming a wiring pattern on the surface of the board and forming the external terminal portion by providing the laminated member on a pad of the wiring pattern.

According to the method for manufacturing the above-mentioned circuit board, the circuit board concerned in the first aspect of the invention is realized easily, and advantageous effect similar as the effect in the circuit board concerned in the first aspect of the invention can be obtained.

Further, the invention is considered on the above-mentioned circumstances, the problem is to provide a circuit board module connecting a battery case and a circuit board with easy construction and low cost, and a method for producing the circuit board module.

To solve the above problems, the invention has the following technical means.

According to a circuit board module concerned in a fourth aspect of the invention, the circuit board module is characterized by comprising a battery case storing a battery, a circuit board for carrying out charge and discharge of the above-mentioned battery, and a joint member for connecting the battery case and the circuit board electrically and/or mechanically, wherein the above-mentioned joint body is constructed by clad material that plural metal layers having different metal material each other are laminated. Concretely, at least one metal layer of the metal layers of the joint body consists of the same kind of metal material of the battery case. The joint body is constructed by a first metal layer made of Ni and a second metal layer made of Al.

According to the construction, since the joint body for connecting the battery case and the circuit board is constructed by clad material that plural metal layers made of Ni and Al are laminated, when the battery case is made of Al for example, the battery case and the circuit board can be joined using welding for example by contacting the second metal layer side made of Al of the clad material. The first metal layer side made of Ni of the clad material can be joined on the circuit board by soldering for example. That is, since the battery case and the circuit board can be connected directly though the joint body made of clad material there is no need to use conventional joining member so as to design decrease of parts cost. Since there is no need to weld the above-mentioned joining member to the battery case, welding time is removed so as to design decrease of operation cost.

According to a preferable mode for carrying out, thickness ratio of the first metal layer and the second metal layer of the joint body is about 1:1 to about 1:2. As above-mentioned, when the joint body is joined on the circuit board by soldering using reflow process for example, the joint body happens to bend by heat at reflow. This is caused by difference of linear expansion coefficient to temperature change at each metal material because of laminating different metal materials each other though it depends on size, shape, and the like of the joint body. That is, since Al of the second metal layer is comparatively larger than Ni of the first metal layer in the above-mentioned linear expansion coefficient, Al expands comparing with Ni and the joint body bends so that the second metal layer covers the first metal layer.

Then, in the invention, bent of the joint body is depressed by setting thickness ratio of both metal layers as the above-mentioned. That is, because elastic coefficient of Ni is generally larger than that of Al, namely Ni is harder than Al, as the result. Ni acts to compress elastically Al so as to depress expansion of the second metal layer made of Al. Thus, bent of the join body can be depressed. Therefore, the joint body can be soldered well on the circuit board without occurring soldering failure even at reflow process.

According to another preferable mode for carrying out of the invention, the joint body is roughly rectangle shape and is used being bent at the designated position in longitudinal direction. Even by this, bent of the joint body at reflow is depressed. That is, the joint body has bent at whole length of longitudinal direction because of difference of linear expansion coefficient to temperature change of difference metal material each other as describe above. Then, by previously bending the join body at the designated position in longitudinal direction before joining to the battery case and the circuit board, region generating bent is made narrow being separated at bent portion. Because of that, since degree of bent at the narrowed region becomes small comparing with bent at whole length of longitudinal direction so as to depress further bent of the joint body.

According to a method for mounting a circuit board module concerned in a fifth aspect of the invention, the method is characterized by that the circuit board module has a battery case, a circuit board for carrying out charge and discharge of the battery, and a joint body for connecting the battery case and circuit board electrically and/or mechanically, further uses the joint body concerned in the fourth aspect of the invention, and comprises a process soldering the first metal layer side of one end of the joint body at a terminal portion formed on the circuit board by reflow process, and a process welding the second metal layer side of the other end of the joint body.

According to the method for manufacturing, the circuit board module concerned in the fourth aspect of the invention is realized by the method for manufacturing, and advantageous effect similar as the effect in the above-mentioned circuit board module can be obtained.

Another characteristic and advantages of the invention will be made clear by detailed description of below referring attached figures.

DESCRIPTION OF THE PREFERRED EMBODIMENTS

A preferred mode for carrying out the invention will be described concretely referring attached figures. In the following description, FIG. 5 of the perspective view showing the battery pack described in the prior art is referred again.

The battery pack P is detachable from the main body (not shown) of the portable telephone for example, and has a case 1 made of resin, a battery cell, not shown, consisting of a lithium ion battery or manganese battery assembled in the case 1, and a circuit board 2 connected to the battery as shown in FIG. 5. The circuit board 2 has a function supplying electric power from the battery cell to the main body side of the portable telephone. The above main body can charge the battery cell, and the circuit board 2 has a function supplying electric power for charge from the above main body to the battery cell. With these functions, the circuit board 2 has a protecting circuit (not shown) preventing over discharge and over charge.

The case 1 is formed in roughly rectangular prism shape having hollow structure, and openings 5 are formed at back face thereof as shown in FIG. 5. From the openings 5, external terminal portions 4 (described later) formed at the surface of the circuit board 2 so as to face onto the outside, and the battery pack P is connected electrically to the above main body by contacting the external terminal portions 4 to connector pins (not shown) of the main body side of the portable telephone.

The circuit board 2 consists of a rigid type board piece 20 made of glass epoxy resin and having roughly rectangular shape, and located near from one end face 1a of longitudinal direction of the case 1 so as to avoid to contact the battery cell in the case 1. In the circuit board 2, connecting terminals 3 which are connected to the battery cell in the case 1, which consist of metal pieces such as Ni, etc. for example, and one ends of which are connected to the circuit board 2. On the circuit board 2, a wiring pattern (not shown) made of cu foil, etc. is formed on the surface and electronic parts such as an IC chip, resistors, and so on are assembled at designated portions of the wiring pattern.

On the surface of the circuit board 2, lands 6 are formed in thin film shape as a part of the wiring pattern 6. On the lands 6, laminated members 8 in which plural metal layers having metal materials differing each other and being as a so-called clad metal are provided so as to construct as external terminal portions 4. Moreover, on the surface of the circuit board 2, a non-conducive layer 9 being called green resist and having electric non-conductivity for protecting the surface and the wiring pattern of the circuit board 2 is formed on the region except the region where the lands 6 are formed.

Figure 2:
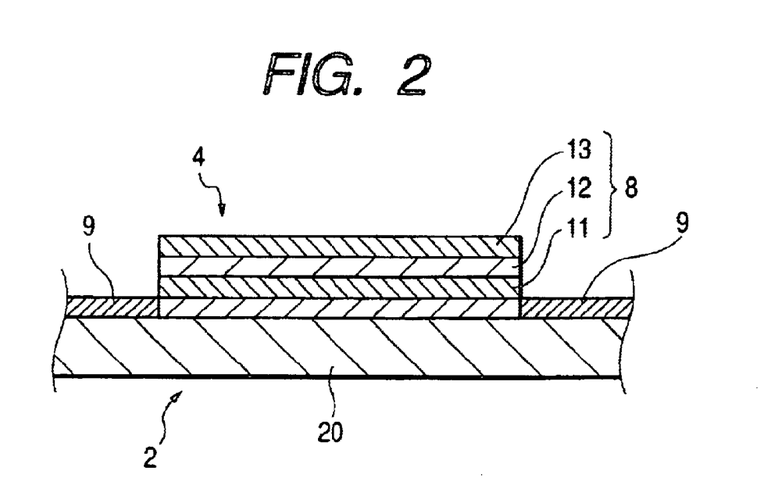
FIG. 2 shows a sectional view of main portion of an external terminal and a board.

The laminated members 8 consist of a first metal layer 11 made of Cu, a second metal layer 12 formed on the upper face of the first metal layer 11 and made of stainless steel for example, and a third metal layer 13 formed on the upper face of the second metal layer 12, made of Ni alloy, and being the highest layer as shown in FIG. 2.

The thickness of whole laminated member 8 is 150 to 250 μm, thickness of the second metal layer 12 made of stainless steel is set so as to be larger comparing with thickness of the first metal layer 11 and thickness of the third metal layer 13. Thus, the second metal layer 12 functions as reinforcing material of the laminated members 8.

Thus, by using the laminated members 8 constructed with the clad material consisting of the first to the third metal layers 11, 12, and 13 having different metal materials each other for the external terminals 4, material cost can be decreased sharply comparing that the Ni pieces 21 cut from hoop material made of generally expensive pure Ni like as the conventional construction for example. Because of that, decrease of parts cost in the circuit board 2 can be designed.

Since the first metal layer 11 of the laminated members 8 are made of Cu, it is possible to solder easily on the lands 6 of the wiring pattern formed on the board piece 20. That is, since material of the first metal layer 11 of the laminated members 8 is made of Cu which is the same material as the wiring pattern, it is possible to raise contact performance because connection between both metals becomes good state in the case that the laminated members 8 are soldered on the lands 6 of the wiring pattern.

Since the second metal layer 12 is made of stainless steel, the laminated members 8 have corrosion resistance, rigidity of the laminated members 8 rises, and bent of the circuit board 2 can be depressed when the laminated members 8 are soldered on the circuit board 8. That is, when the laminated members 8 are soldered on the circuit board 8 by reflow process, the laminated members 8 happen to bend because of difference of linear expansion coefficient between each metal layers 11, 12, and 13. However, by making thickness of the stainless steel thick comparing with the first and the third metal layers 11 and 13, bent of whole of the laminated members 8 can be depressed because the first and the third metal layers 11 and 13 are compressed elastically as the result.

Since the third metal layer 13 is constructed in thin film shape by the Ni alloy, the conventional occurrence of scratch on the surface can be depressed so that yield improves. The laminated members 8 are not limited to the above construction in the number of layers, material, etc. For example, on upper face of Ni alloy of the third metal layer 13, Au may be soldered for ornament.

Moreover, the battery pack P can keep good connecting state without occurring contact failure to the main body of the external apparatus, for example, portable telephone, and low cost is realized because the circuit board 2 having the external terminals 4 constructed as the above-mentioned is installed in the battery pack P.

Figure 3:
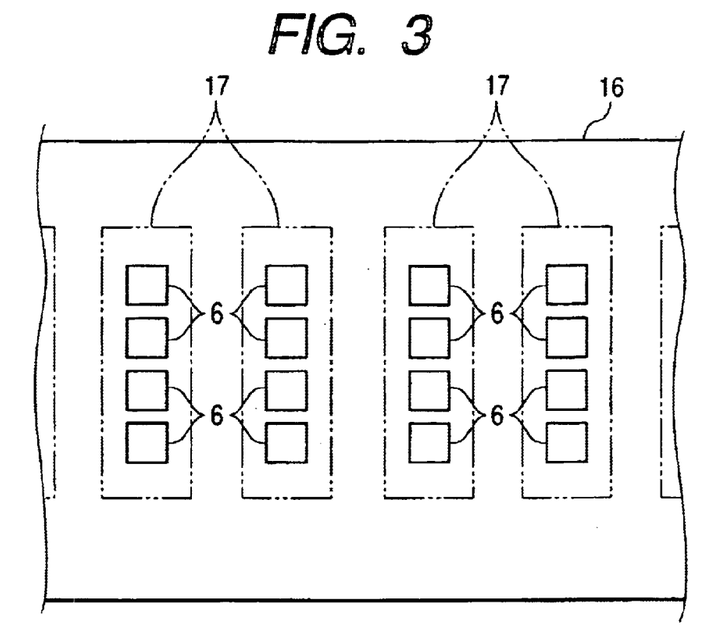
FIG. 3 shows a view for describing a method for manufacturing a circuit board.

Next, a method for manufacturing the above-mentioned circuit board 2 will be described. First, the circuit board 2 is made using a long gathered board 16 as shown in FIG. 3. That is, the gathered board 16 consists of a general rigid type original board made of glass epoxy resin, and a wiring pattern is formed on surface of the gathered board 16 in regions 17 (within one dot chains in FIG. 3) corresponding to the above-mentioned circuit board 2 by the above-mentioned well-known photo lithography method.

That is, needless part of Cu foil is removed by etching after applying resist material on the gathered board 16 put with Cu foil, and exposing and developing using a mask where the designated pattern is formed. Thus, a wiring pattern including lands 6 is formed at a region corresponding to the circuit board 2. Next, a non-conductive layer 9 made of epoxy resin, etc. is formed at the region except the region where the lands 6 are formed on surface of the circuit board 2 using well-known photo lithography method even in this case.

Moreover, laminated members 8 as clad material are formed by forming a belt shape hoop material bonding plural thin film shape metal body such as Cu, stainless steel, Ni, etc. using cold rolling process or hot rolling process for example and cutting the hoop material into the designated size, for example, 3 mm square.

Next, soldering is carried out to join the laminated members 8 to the circuit board 2 by reflow process. That is, solder paste is previously applied on the lands 6 of the circuit board 2 and the laminated members 8 are put on the lands 6 applied with solder paste setting the first metal layer 11 made of Cu down. At this time, an IC chip and electronic parts such as resistors, etc. may be put on pat portions being a part of the wiring pattern.

In this case, the laminated members 8 and the electronic parts are bonded by adhesiveness of the solder paste. Designated adhesive or tape may be used. Next, the circuit board 2 is put into a reflow furnace so as to heat. Heating temperature of this case is set higher than melting point of the solder and lower than heat resisting temperature of the circuit board 2 and the laminated members 8. Thus, solder is melted again in the reflow furnace and the laminated members 8 and the electronic parts are soldered on the circuit board 2 by being cooled and hardened after that.

Figure 1:
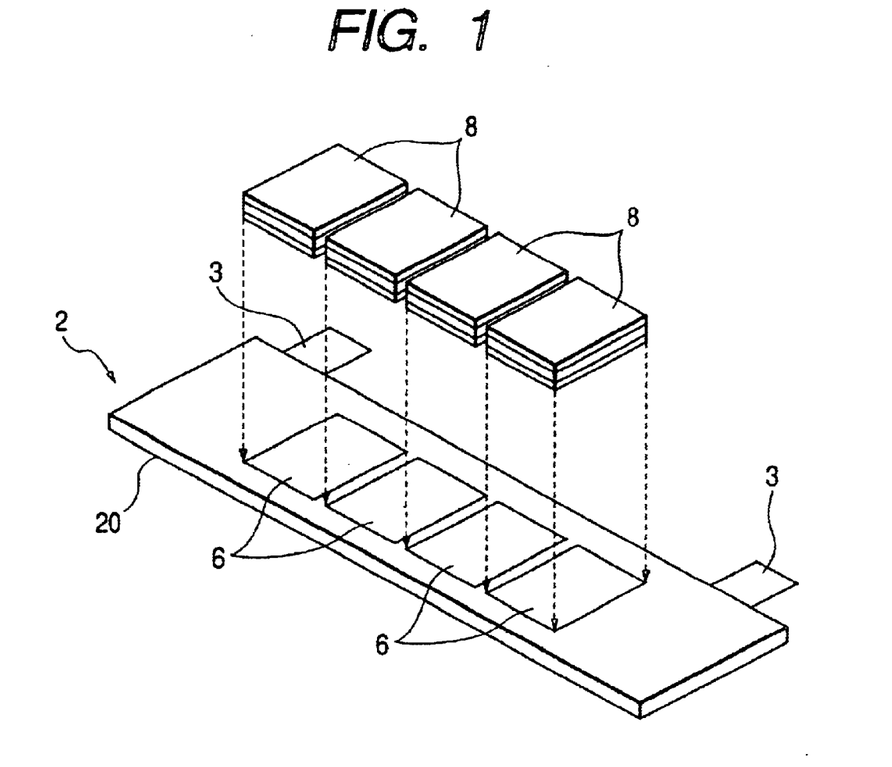
FIG. 1 shows a perspective view of a circuit board according to the invention.
Figure 4:
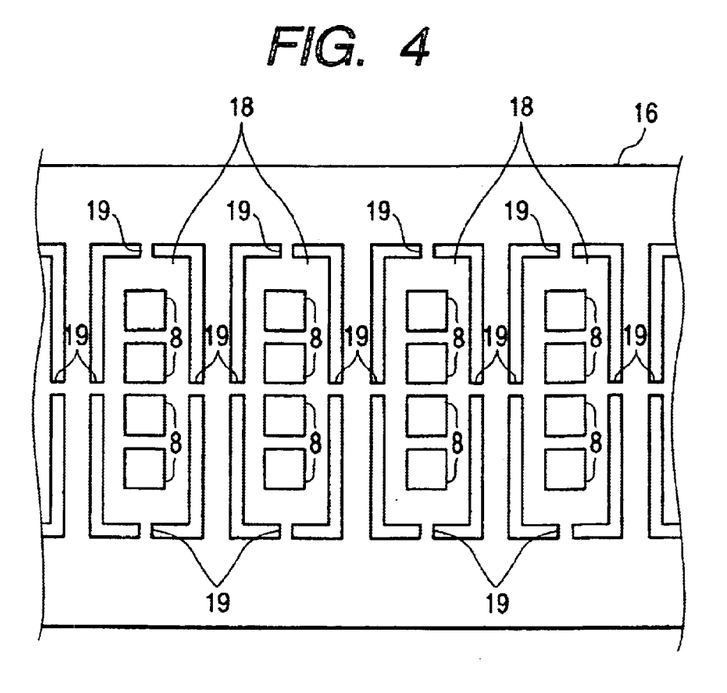
FIG. 4 shows a view for describing a method for manufacturing a circuit board.

After that, the gathered board 16 is stamped along the above-mentioned region 17 by the designated die as shown in FIG. 4 and plural board articles 18 corresponding to the circuit board 2 are formed. After cutting connecting portions 19, the circuit board 2 shown in FIG. 1 is obtained by connecting the connecting terminals 3. The circuit board 2 made by such the way is assembled in the battery pack P so that the external terminals 4 face outside from the openings 5.

Figure 7:
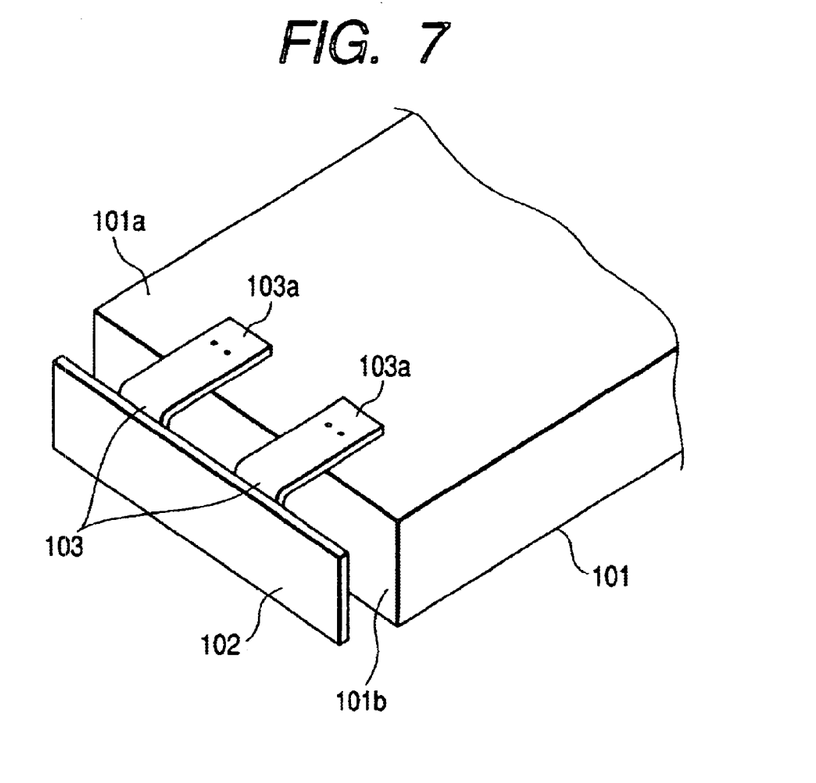
FIG. 7 shows a perspective view of main portion of a circuit board module according to the invention.
Figure 8:
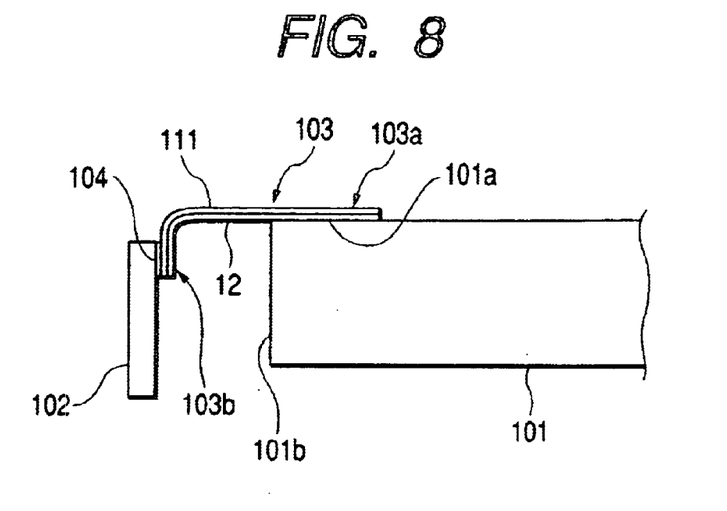
FIG. 8 shows a sectional view of main portion of the circuit board module shown in FIG. 7.

A circuit board module according to the invention is used for being assembled in a body of equipment of a battery pack used for a portable telephone and a note type personal computer. That is, the circuit board module includes a battery case 101 storing a cell for battery and a protection circuit for supplying electric power from the cell for the battery to a main body of the portable telephone, etc. and preventing over-discharge and over-charge as shown in FIG. 7 and FIG. 8, and has a circuit board 102 installed with a connector and electronic parts not shown and plural bendable joint bodies 103 for connecting the both electrically and/or mechanically.

The battery case 101 is formed in roughly rectangular prism shape having, and the external form thereof is formed by Al in order to design lightening an apparatus. Cells for battery such as lithium ion battery, manganese battery, etc. are used for the battery stored in the battery case 1, but batteries are not limited to these.

The circuit board 102 consists of a rigid type printed wiring board made of glass epoxy resin and having roughly rectangular shape, and a wiring pattern made of Cu foil, etc., not shown, is formed on surface thereof. At a part of the wiring pattern, pat portions 104 joined to the above-mentioned joint body 103 and being as terminal portions are formed.

Figure 9A:
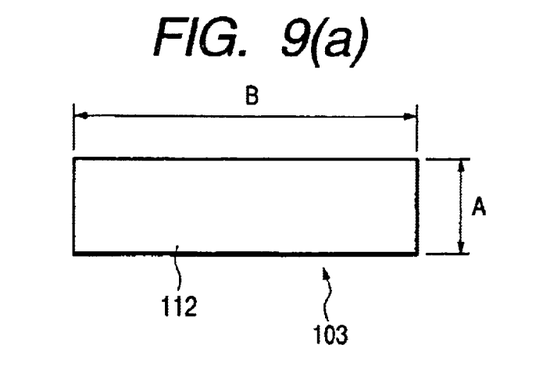
FIG. 9 shows an external form view of a joint body.
Figure 9B:
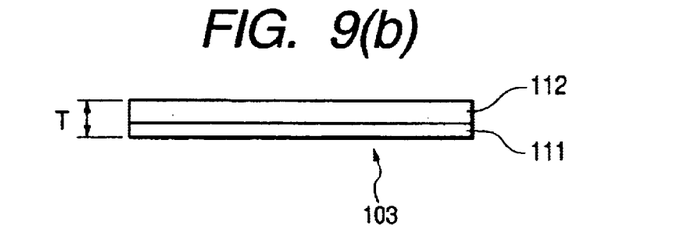

The joint body 103 consists of so called clad material which metal bodies made of different metal material each other are bonded, and is constructed with a first metal layer 111 made of Ni for example and a second metal layer 112 made of Al in the mode for carrying out as shown in FIG. 9. That is, the first metal layer 111 is formed by metal material suitable for soldering, and on the other hand, the second metal layer 112 is formed by metal material of the same kind as material of the battery case 101. The joint body 103 is formed in roughly long rectangular shape: about 3 mm in length A and 10 mm in width B as an example with plane view. Thickness T of the joint body 103 is formed in about 100 to 200 μm so as to bend easily. The first metal layer 111 and the second metal layer 112 are set to each thickness thereof by suitable ratio of thickness as described later.

Back to FIG. 7 and FIG. 8, one end portion 3a of the joint body 103 is joined to the battery case 101 by welding. In this case, the second metal layer 112 consisting of the same kind of metal material as the battery case 101 is contacted along the upper face end portion 1a of the battery case 1, and the joint body 103 is joined to the battery case 101 by spot welding for example. The other end portion 3b of the joint body 103 is joined to the circuit board 102 by soldering. In this case, the joint body 103 is joined to the circuit board 102 by that the first metal layer 111 is soldered contacting to the pad portion 104 of the circuit board 102.

Thus, by using the clad material having the same kind of metal material as material of the battery case 101, the joint body 103 can be joined directly to the battery case 101. When the clad material has another metal material suitable for soldering, the joint body 103 can be joined directly to the circuit board 102. That is, since the battery case 101 and the circuit board 102 are connected directly through the joint body 103 made of clad material, there is no need to use a joining member of the conventional construction and decrease of parts cost can be designed. Since it is not need to weld the above-mentioned joining member to the battery case 1, time to weld is saved and decrease of operation cost can be designed.

The joint body 103 is bent to direction crossing at right angles to longitudinal direction at neighborhood of intermediate portion of longitudinal direction so that surface of the circuit board 102 faces to a side face 1b of the battery case 101. Thus, it becomes possible to make size of the whole circuit board module compact size so as to contribute to miniaturization of the battery pack.

Figure 10:
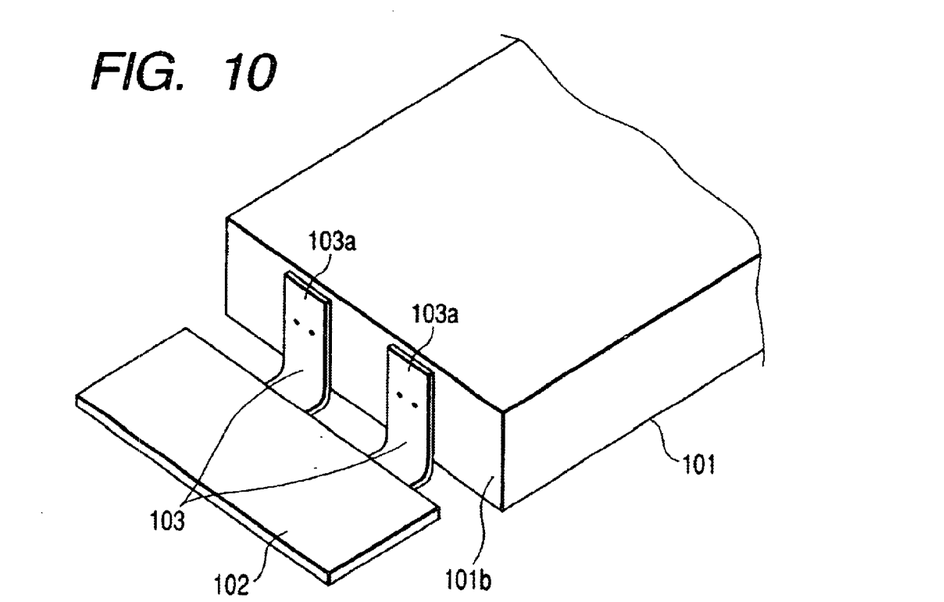
FIG. 10 shows a perspective view of main portion of an another circuit board module.
Figure 11:
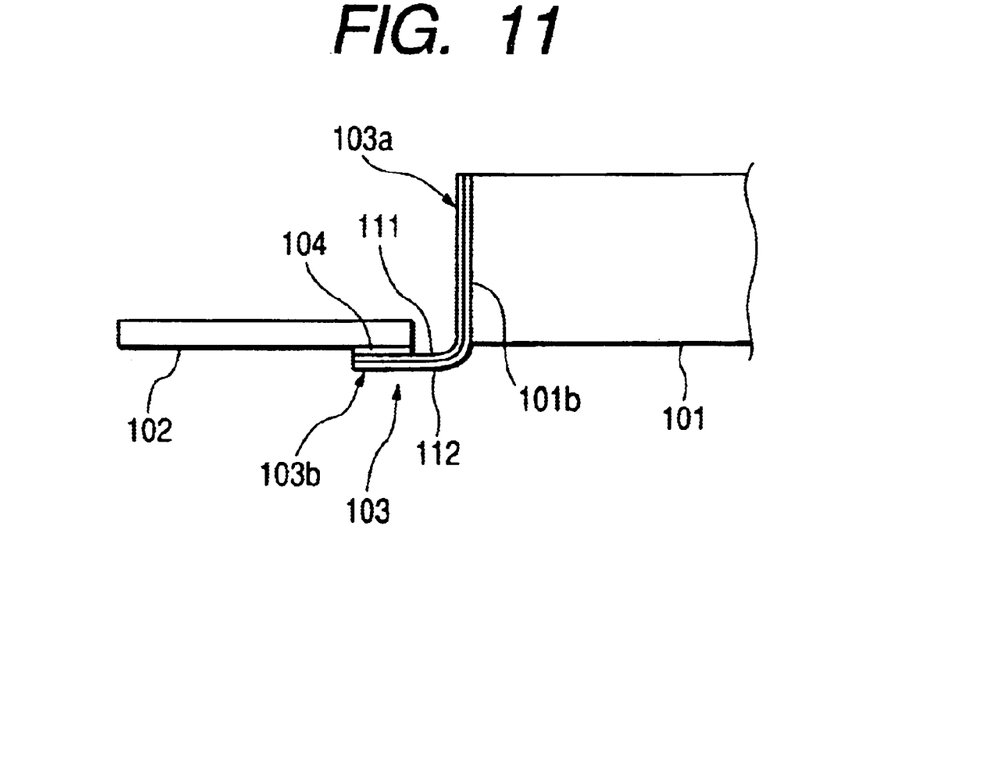
FIG. 11 shows a perspective view of main portion of the circuit board module shown in FIG. 10.

In final mode at connecting the battery case 101 and the circuit board 2, the battery case 101 and the circuit board 102 may be connected so that the right side and the wrong side of the circuit board 102 are arranged to direction crossing at right angles to a side face 1b of the battery case 101 as shown in FIG. 10 and FIG. 11. That is, one end portion 3a of the joint body 103 is contacted along the side face 1b of the battery case 102 and is spot-welded. The other end portion 3b of the joint portion 103 is soldered on the pad portion 104 of the circuit board 102. The joint portion 103 is bent to direction crossing at right angles to longitudinal direction at neighborhood of intermediate portion of longitudinal direction so that the right side and the wrong side of the circuit board 102 become roughly parallel to upper and lower face of the battery case 101.

Since the battery case 101 and the circuit board 102 can be connected directly through the joint body 103 even by the construction, advantageous effect similar as the circuit board module of the construction shown in the above-mentioned FIG. 7 and FIG. 8 is obtained. Thus, various kinds of modes are possible in the mode for connecting the battery case 101 and the circuit board 102.

Next, a method for manufacturing the above-mentioned circuit board module will be described briefly. First, a circuit board 102 constructed by general rigid type original board made of glass epoxy resin is prepared, and a wiring pattern is formed on surface of the circuit board 102 by the well-known photo lithography method. That is, needless part of Cu foil is removed by etching after applying resist material on the circuit board 102 put with Cu foil, and exposing and developing using a mask where the designated pattern is formed. Thus, a wiring pattern including pad portion 104 is formed on the circuit board 102.

Moreover, a belt shape hoop material is formed by bonding two kinds of metal bodies made of Ni and Al using cold rolling process or hot rolling process for example and cutting the hoop material into the designated size, a joint body 103 as clad material of roughly long rectangle shape is formed.

Next, soldering is carried out to join the joint boy 103 to the circuit board 102 by reflow process. That is solder paste is previously applied on the pad 104 of the circuit board 102. A first metal layer 111 side of the other end portion 3b of the joint portion 103 is put on the pad portion 104 applied with solder paste. At this time, an IC chip and electronic parts such as resistors, etc. may be put on another pad portion.

In this case, the joint body 103 and the electronic parts are bonded by adhesiveness of the solder paste. Designated adhesive or tape may be used. Next, the circuit board 102 is put into a reflow furnace so as to heat. Heating temperature of this case is set higher than melting point of the solder and lower than heat resisting temperature of the circuit board 102 and the joint body 103. Thus, solder is melted again in the reflow furnace and the joint body 103 and the electronic parts are soldered on the circuit board 102 by being cooled and hardened after that.

Next, the joint body 103 is bent to direction crossing at right angles to longitudinal direction of the joint body 103 at the designated position of neighborhood of the circuit board 102. In this case, the joint body 103 is bent so that the second metal layer 112 faces inside using the designated die not shown.

After that, the joint body 103 is arranged to upper and lower directions along a side face 1b of the battery case 1, a second metal layer 112 side of one end portion 3a of the joint body 103 is contacted to an upper end portion 1a of the battery case 1, and the one end portion 3a of the joint body 103 and the battery case 101 are joined. Thus, a circuit board module connected with the battery case 101 and the Circuit board 102 though the joint body 103 is obtained. In the above-mentioned method for manufacturing, process soldering the join body 103 to the circuit board 2, bending the joint body 3, and welding the joint body 103 to the battery case 101 is not limited to the above-mentioned process.

Figure 12:
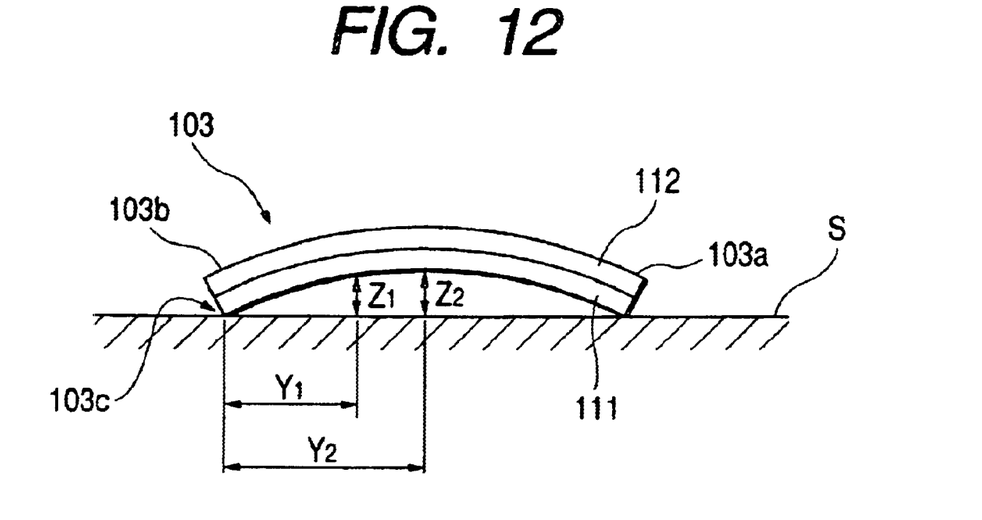
FIG. 12 shows a view for describing bent of a joint body.

By the way, in the above-mentioned method for manufacturing, there is a case that bent of the joint body 103 generates by heat of reflow process as shown in FIG. 12 when the joint body 103 is soldered to the circuit board 102 by reflow process. This occurs because of difference of linear expansion coefficient to temperature change in this case, the joint body 103 bends so as to make concave to lower side so that gap generates between a put face S and the first metal layer 111 because linear expansion coefficient of Al is larger than that of Ni. Thus, when the joint body 103 has bent, contacting area between the other end portion 3b of the joint body 103 and the pad portion 104 formed on the circuit board 102 becomes small so as to obtain good performance of contact at soldering.

Then, in the mode for carrying out, the above-mentioned bent is depressed as far as possible by setting thickness ratio of the first metal layer 111 and the second metal layer 112 to suitable value. Concretely, in the mode for carrying out, Al and Ni are used for metal material of each of metal layers 111 and 112 constructing the joint body 3, and thickness ratio is set to about 1:1 to 1:2. That is, since elastic coefficient of Ni is generally larger than that of Al, namely Ni is harder than Al, by making thickness of the first metal layer 111 made of Ni comparatively thicker than thickness of the second metal layer 112 made of Al, as the result Ni acts to Al so as to compress elastically, and expansion of Al is depressed. Thus, bent of the joint body is depressed. Value of the above-mentioned thickness ratio is obtained by experiment of applicant of the invention shown below.

The method and result of the experiment will be described. The joint body 103 is used as samples: length A is about 103 mm; width B is about 110 mm; thickness T are 100 μm, 150 μm, 175 μm, and 200 μm as shown in FIG. 9.

Varying thickness ratio of Al and Ni respectively at each thickness T, degree of bent of the joint body 103 is obtained.

For degree of bent of the joint body 3, height from put face S to curved face of the first metal layer 111 is measured as shown in FIG. 12. Concretely, height from put face S to curved face of the first metal layer 111 (hereinafter "displacement value $Z_1$") at position that distance Y from end portion 3c of the joint body 103 is about 3 mm and height from put face S to curved face of the first metal layer 111 (hereinafter "displacement value $Z_2$") at position that distance Y from the end portion 3c is about 5 mm (intermediate portion of the joint body) are measured respectively. Since size of the pad portion 104 of the circuit board 102 is formed about 3 mm square, displacement value $Z_1$ at position that distance $Y_1$ is about 3 mm is measured in order to obtain degree of the join body 103 to the pad portion 104.

Figure 13:
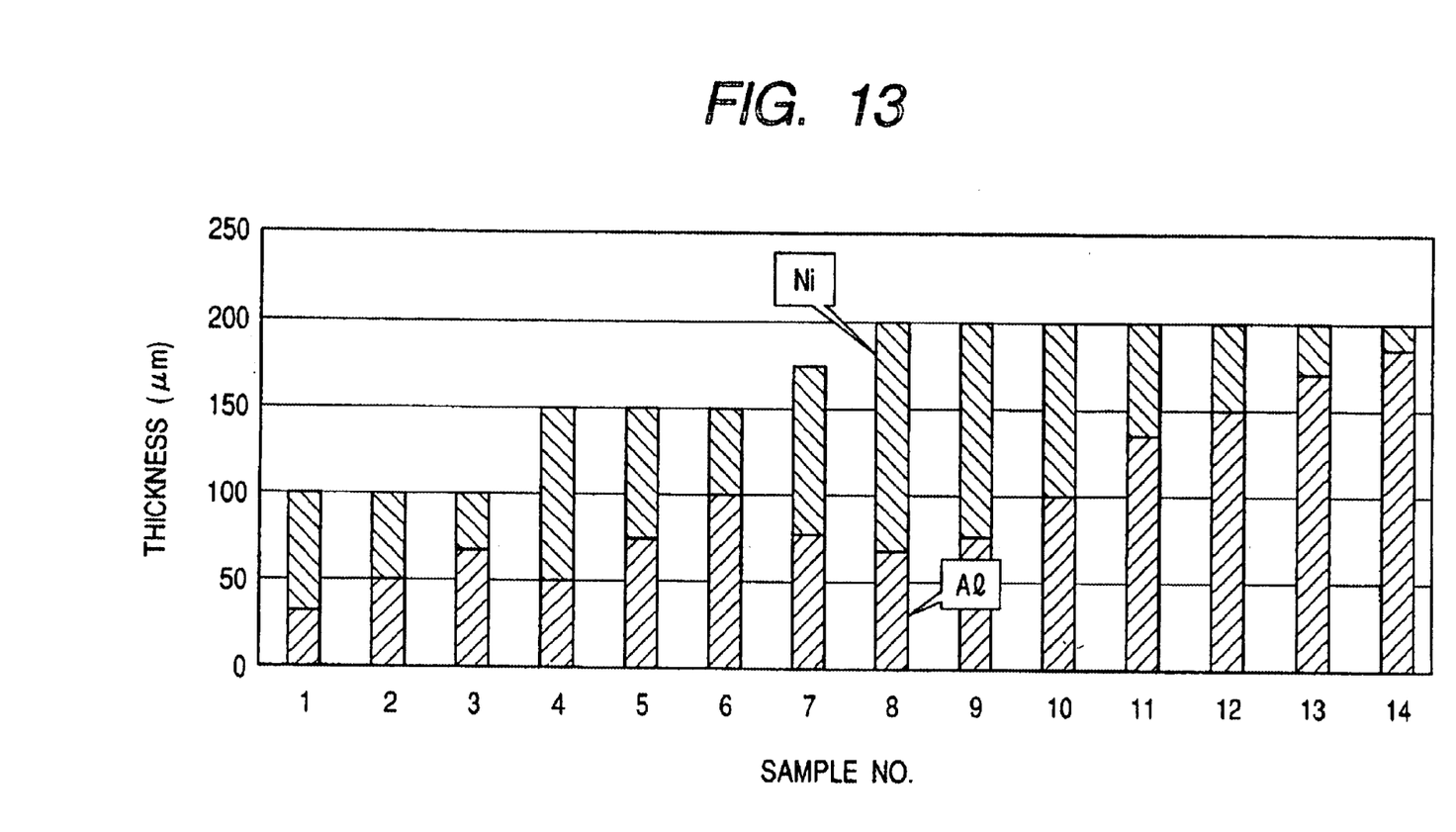
FIG. 13 shows a view showing thickness of each sample in experiments.
Figure 14:
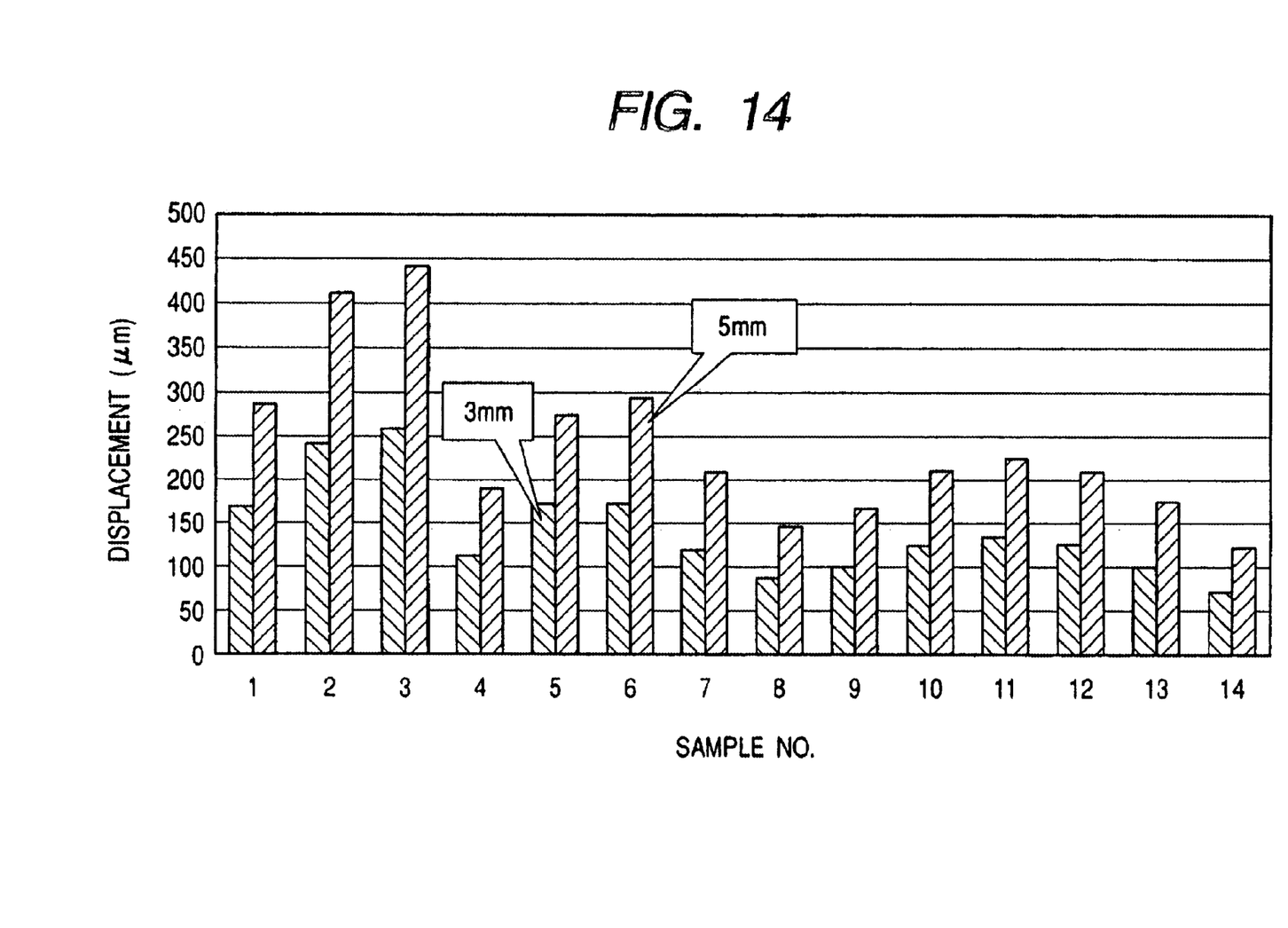
FIG. 14 shows a view showing displacement value of each sample in experiment.
Figure 15:
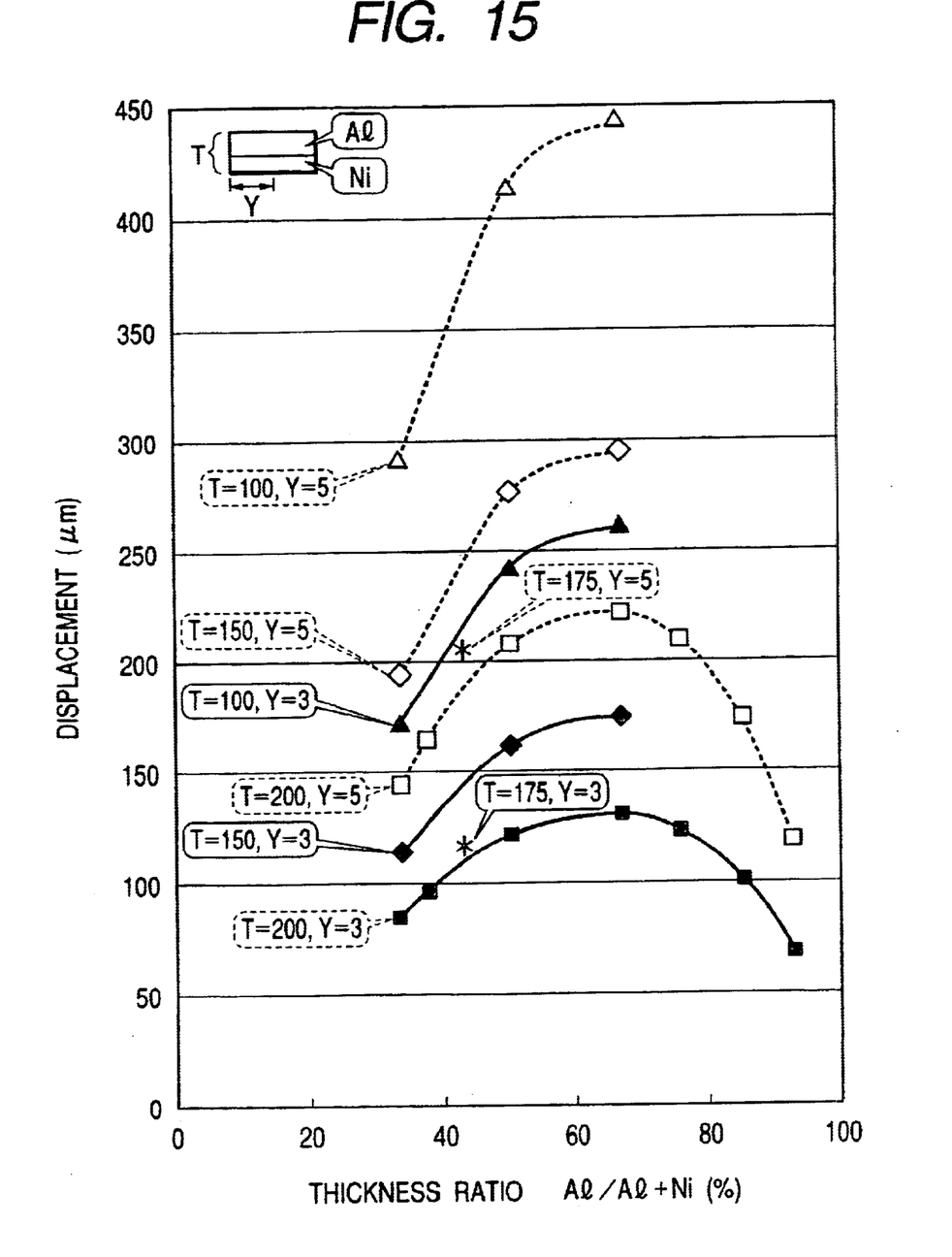
FIG. 15 shows a view showing relation between displacement and thickness ratio of each sample in experiment.

Table 1 is a table showing thickness T of the joint body 3, thickness ratio of the first metal layer 111 and the second metal layer 12, and displacements $Z_1$ and $Z_2$ at each sample. FIG. 13 is a graph showing thickness of the joint body 103 at each sample. FIG. 14 is a graph showing displacement at each sample. FIG. 15 is a view showing relation of displacement and thickness ratio at each sample.

material. Because of that, the joint body 103 having the above-mentioned thickness ratio can be soldered well depressing bent at reflow process. Therefore, the joint body 103 consisting of clad material having the above-mentioned thickness ratio is preferably used when the joint body 103 is connected to the circuit board 102 by reflow process.

Although the clad material of size of 3 mm in length A and 10 mm in width B is used in the above-mentioned experiment, size for actual use is not limited to this size.

Figure 16:
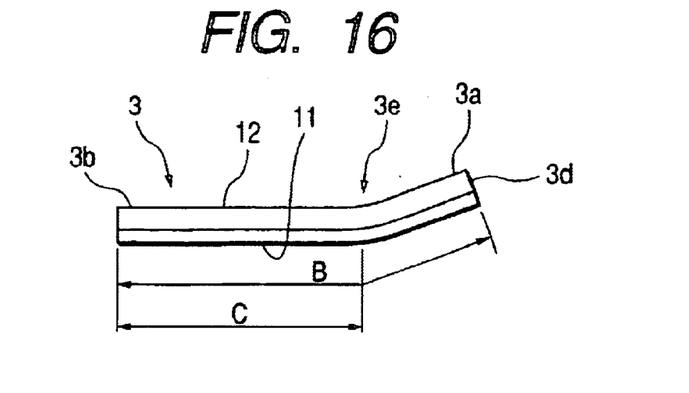
FIG. 16 shows a sectional view showing a variation example of a joint body.

The following method may be carried out in order to depress bent at reflow process of the joint body 103. That is, the joint body 103 is used being previously bent at the designated position in the longitudinal direction as shown in FIG. 16. Concretely, the joint body 103 is bent so as to incline upward with the designated angle to direction crossing at right angles with the longitudinal direction at the designated position 3e near from end face 3d of the one end portion 3a of the joint body 103 before the joint body 103 is soldered on the circuit board 102.

Although the joint body 103 has bent at all length of longitudinal direction thereof as above-mentioned, region where bent occurs by heat at reflow process is made narrow being separated at the designated position 3e by bending at

TABLE 1

| Sample No. | | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| Thickness | Al | 33.3 | 50 | 66.7 | 50 | 75 | 100 | 75 | 66.7 | 75 | 100 | 133.3 | 150 | 170 | 185 |
| (μm) | Ni | 66.7 | 50 | 33.3 | 100 | 75 | 50 | 100 | 133.3 | 125 | 100 | 66.7 | 50 | 30 | 15 |
| | Total | | 100 | | | 150 | | 175 | | | | 200 | | | |
| Al/Al + Ni (%) | | 33.3 | 50 | 66.7 | 33.3 | 50 | 66.7 | 42.8 | 33.3 | 37.5 | 50 | 66.7 | 75 | 85 | 92.5 |
| Displace- | $Z_1$ | 171 | 242 | 260 | 113 | 162 | 173 | 116 | 85 | 97 | 122 | 130 | 122 | 102 | 69 |
| Ment | Y = 3 mm | | | | | | | | | | | | | | |
| (μm) | $Z_2$ | 290 | 412 | 442 | 193 | 275 | 294 | 203 | 145 | 164 | 207 | 221 | 208 | 172 | 118 |
| | Y = 5 mm | | | | | | | | | | | | | | |

According to FIG. 13 to FIG. 15, although sample 114 is the smallest in values of displacements $Z_1$ and $Z_2$, that is, bent is the smallest, thickness of the first metal layer 111 at the sample is 15 μm. For roll process at making clad material, the first metal layer 111 made of Ni needs more than about 50 μm. Because of that, the sample 114 is not preferable as a clad material. By the same reason, samples 112 and 113 are not preferable.

Although samples 4 and 8 are comparatively small in values of displacements $Z_1$ and $Z_2$, thickness of the second metal layer 112 of the sample 4 is 50 μm and thickness of the second metal layer 112 of the sample 8 is 66.7 μm. Thickness of the second metal layer 112 made of Al needs more than 75 μm in order to secure strength with the battery case 101 at welding. Because of that, the samples 4 and 8 are not preferable as a clad material.

By valuing with such the view point, joint bodies 103 small in degree of bent and suitable for the above-mentioned condition are samples 7, 9, 10, and so on. Considering about the samples 7, 9, and 10, thickness ratio of the first metal layer 111 and the second metal layer 112 is within about 1:1 to about 1:2. Therefore, by setting such the thickness ratio, bent of the joint body 103 can be decreased.

That is, it is considered that expansion of whole joint body 103 is depressed and the bent is depressed by making thickness of the second metal layer 112 made of Al comparatively smaller than thickness of the first metal layer 111 made of Ni because Al is comparatively larger than Ni in linear expansion coefficient to temperature change of metal the designated position 3e of the one end portion 3a. According to FIG. 16, bent occurs at region C by being separated at the designated position 3e to whole length B of longitudinal direction. Because of that, since degree of bent at narrowed region C becomes small comparing with bent at whole length B of longitudinal direction, it is possible to further depress bent of the joint body 103.

Figure 17:
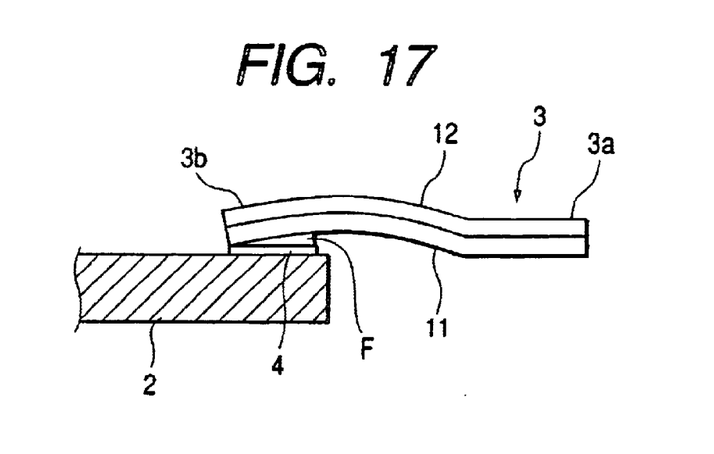
FIG. 17 shows a view showing a mounting state of the joint body shown in FIG. 16 on a circuit board.
Figure 18:
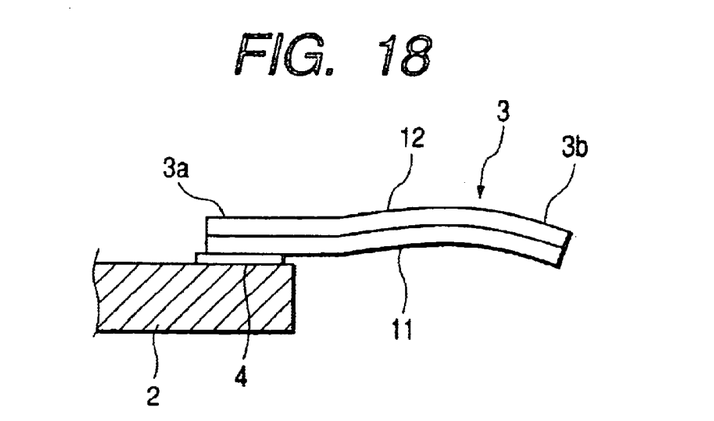
FIG. 18 shows a view showing an another mounting state of the joint body shown in FIG. 16 on a circuit board.

By the above-mentioned method, the first metal layer 111 side of the other end portion 3b of the joint body 103 bent at a part thereof depressed to depress bent is soldered on the pad portion 104 of the circuit board 2, and suitable solder fillet F is formed as shown in FIG. 17. Although shape of the joint body 103 returns to the original shape by being cooled and hardened after reflow process, the bent is illustrated with a little exaggeration in FIG. 17. The one end portion 3a side comparatively small in bent of the joint body 3, a part of which is bent may be soldered on the pad portion 104 of the circuit board 102 as shown in FIG. 18.

Although a method bending previously a part of the joint body 103 and a method setting thickness ratio of the above-mentioned each of metal layers 111 and 112 are described combination of these methods may be used.

Of course, scope of the invention is not limited to the above-mentioned mode for carrying out. For example, the laminated members 8 described in the above-mentioned mode for carrying out may be constructed with two layers or more than four layers, and size and shape are not limited to the construction shown in the above-mentioned mode for carrying out. The circuit board 2 is not limited to application for assembling in the above-mentioned battery pack P, and may be applied for a small size electronic apparatus such as a camera, a video camera, and the like.

For further example, metal material of each of the metal layers 111 and 112 of the joint body 103 is not limited to the above-mentioned metal material. Numbers, shape, size, and thickness ratio of the joint body 103 are not limited to the above-mentioned value. Although the joint body 103 is connected with the battery case 101 and the circuit board 102 in the above-mentioned mode for carrying out, the joint body 103 may be used for connecting both circuit boards 102 for example without limiting to this. The battery case 101 may consist of laminated pack for example, from which a terminal piece made of Al projects. The circuit board module is not limited to application for assembling in the above-mentioned battery pack of the note type personal computer, the portable telephone, and the like, and may be applied for another electronic apparatus.

What is claimed is:

1. A circuit board comprising:
   a board; and
   an external terminal portion formed on the board for connecting to an external apparatus;
   wherein the external terminal portion is constructed by substantially rigid clad material having laminated different metal material layers, wherein the external terminal is constructed by a first metal layer made of Cu, a second metal layer formed on the first metal layer and made of stainless steel, and a third metal layer formed on the second metal layer and made of Ni alloy.

2. A battery pack comprising:
   a case;
   a battery installed in the case; and
   a circuit board connected to the battery;
   wherein said circuit board is further comprising:
   a board; and
   an external terminal portion, which is formed on the board for connecting to an external apparatus, is constructed by substantially rigid clad material in which plural different metal material layers are laminated,
   wherein the case has an opening and the circuit board is located so that the external terminal portion faces outside from the opening, and wherein the external terminal is constructed by a first metal layer made of Cu, a second metal layer formed on the first metal layer and made of stainless steel, and a third metal layer formed on the second metal layer and made of Ni alloy.

3. A circuit board module comprising:
   a battery case storing a battery;
   a circuit board for carrying out charge and discharge of the battery; and
   a joint body for connecting the battery case and circuit board electrically and/or mechanically;
   wherein the joint body is constructed by substantially rigid clad material having laminated different metal material layers, and
   wherein at least one metal layer of the joint body consists of the same kind of metal material of the battery case.

4. A circuit board module comprising:
   a battery case storing a battery;
   a circuit board for carrying out charge and discharge of the battery; and
   a joint body for connecting the battery case and circuit board electrically and/or mechanically;
   wherein the joint body is constructed by substantially rigid clad material having laminated different metal material layers, and
   wherein the joint body is constructed by a first metal layer made of Ni and a second metal layer made of Al.

5. A circuit board module according to claim 4, wherein thickness ratio of the first metal layer and second metal layer of the joint body is about 1:1 to about 2:1.

6. A circuit board module according to claim 5, wherein the joint body is roughly rectangle and is used being bent at the designated position in longitudinal direction.

* * * * *